United States Patent [19]
Pease

[11] 3,995,304
[45] Nov. 30, 1976

[54] D/A BIT SWITCH
[75] Inventor: Robert A. Pease, Wilmington, Mass.
[73] Assignee: Teledyne, Inc., Los Angeles, Calif.
[22] Filed: Jan. 10, 1972
[21] Appl. No.: 216,529

[52] U.S. Cl. .................................. 357/36; 307/303; 340/347 DA; 357/28; 357/46
[51] Int. Cl.² .......................................... H01L 27/04
[58] Field of Search ................ 307/303; 357/28, 36, 357/45, 46; 340/347 DA

[56] References Cited
UNITED STATES PATENTS
3,477,031  11/1969  Nagata ............................ 317/235 G
3,747,088  7/1973  Pastoriza .............................. 357/48

FOREIGN PATENTS OR APPLICATIONS
1,906,324  9/1969  Germany ........................ 317/235 G Primary Examiner—William D. Larkins
Attorney, Agent, or Firm—Schiller & Pandiscio

[57] ABSTRACT

A monolithic integrated circuit having a plurality of transistors arranged in groups to comprise sources of binary weighted currents, each group being disposed about a common center of distribution, so as to minimize thermal perturbations of transistor function.

6 Claims, 5 Drawing Figures

U.S. Patent  Nov. 30, 1976  3,995,304
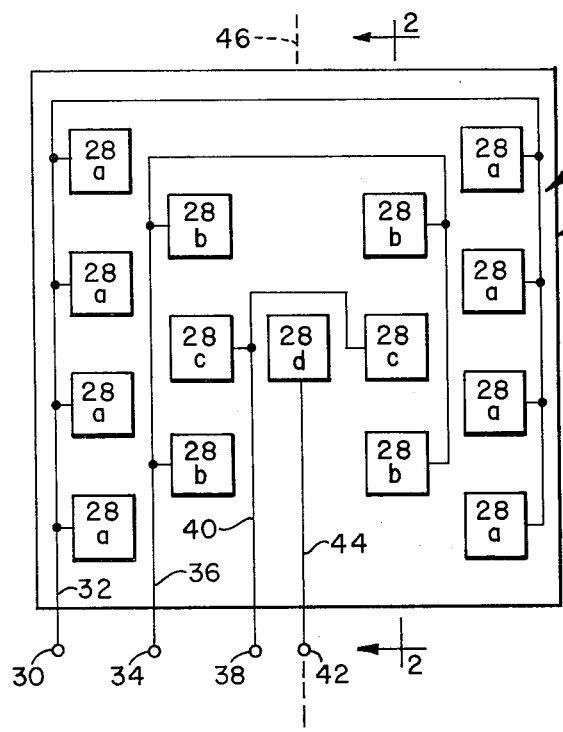
FIG. 1
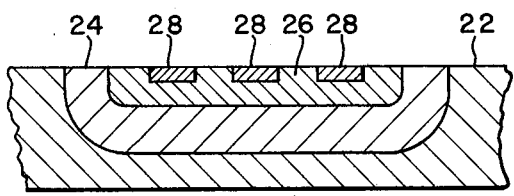
FIG. 2
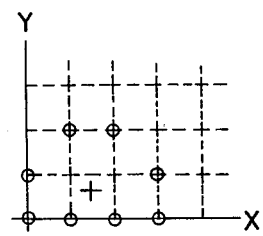
FIG. 3
FIG. 4
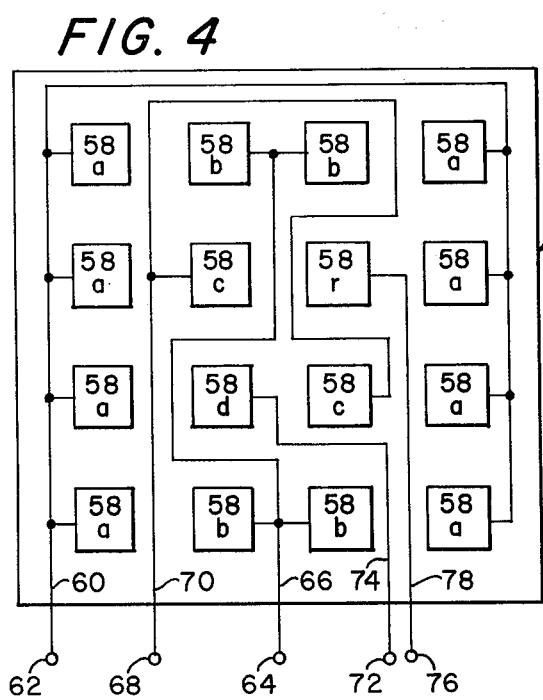
FIG. 5
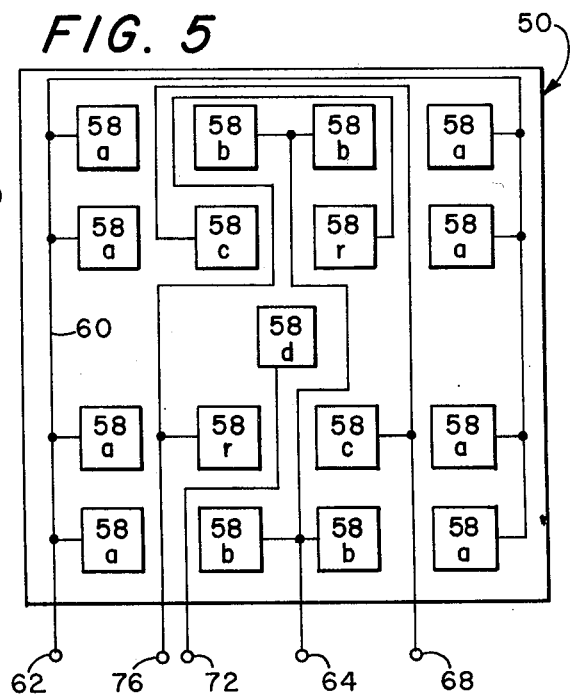

D/A BIT SWITCH

This invention relates to semiconductor switching systems, and more particularly to monolithic integrated multi-bit switches.

A monolithic integrated circuit (MIC) is formed as a simple entity containing isolated transistors and an interconnecting network on a common substrate. Where the MIC includes a plurality of transistor switches, particularly as in analog-to-digital and digital-to-analog conversion, a known procedure is to couple a number of transistor emitters in parallel to keep the same $V_{be}$ and the same biases, to obtain a binary weighted current at a common collector. Thus, typically in such MIC converters, the transistors are arranged in a linear array of successive groups, each group representing a binary bit. The transistors or bit switches are laid out on the substrate with the transistor group representing least significant bit (e.g. one transistor) at one end of the substrate chip, the most significant bit group (e.g. eight transistors) being at the other end of the chip with thw other switches disposed in order in between. Usually, all the transistors are aligned in a single row.

It is well known that MIC transistors exhibit substantial changes in operating parameters with temperature. Normally, thermal gradients extending along a row of transistors or a chip will cause mismatches in $h_{fe}$ and $V_{be}$. These mismatches tend to degrade the performance of the circuit and are often quite unacceptable. Attempts have been made to overcome the problem by using active substrate temperature regulators which have been incorporated in the chip to keep all components at a constant temperature.

The present invention overcomes the foregoing problems through the use of MIC structures with "symmetrical" geometry.

A principal object of the present invention is therefore to provide integrated circuitry involving a plurality of groups of transistors providing different binary weighted currents, wherein each transistor of a plural group is disposed with respect to the other transistor of that group in a predetermined manner about a common center of distribution for all transistors of all plural groups.

Other objects of the present invention will, in part, appear obvious, and will, in part, appear hereinafter. For a fuller understanding of the nature and objects of the present invention, reference should be had to the following detailed description taken in connection with the accompanying drawings wherein:

FIG. 1 is an enlarged, typical schematic layout of an integrated circuit embodying the principles of the present invention;

FIG. 2 is an enlarged schematic cross-section taken along the line 2—2 of the embodiment of FIG. 1;

FIG. 3 is a graph illustrating determination of the center of distribution;

FIG. 4 is an enlarged, schematic layout of another integrated circuit embodying the principles of the present invention and FIG. 5 is an enlarged, schematic layout of an alternative version of the circuit of FIG. 4.

Referring now to FIGS. 1 and 2 there is shown an MIC emplaced on chip 20. The embodiment of FIG. 1 is, for exemplary purposes, shown in FIG. 2 in a multiple emitter npn transistor configuration wherein the system typically is formed on p-type substrate 22 having n-type common collector region 24 in which is embedded p-type common base region 26. Several separate n+ emitter regions 28 are provided. It will however, be recognized that many other IC structures can be used with advantage in the configuration of the present invention.

The embodiment of FIG. 1 is intended to illustrate a typical geometry of a system incorporating the principles of the present invention in a quad bit-switch. Such switches, as is well known in the art, are intended to be logic-operated and when connected with precision resistors and reference circuitry are useful to form digital-to-analog and analog-to-digital converters.

Thus, as shown in FIG. 1, chip 20 includes a plurality of emitter regions (collector and base regions not being shown for the sake of clarity), connected to form groups according to binary significance. Thus, eight emitter regions 28a are all coupled together and are connected to output terminal 30 by line 32, thus representing the most significant binary bit. Similarly, four emitter regions 28b are connected to one another and to terminal 34 by line 36. Two emitter regions 28c are connected to one another and to terminal 38 by line 40. Lastly, a single emitter region 28d (representing the least significant bit) is connected to terminal 42 by line 44.

The distribution of the emitter regions is very important. If the emitter regions are positioned in accordance with the present invention, a substantially linear thermal gradient across the chip will cause minimal thermal perturbations in the operation of the device. First, for optimum performance, each group of emitter regions which comprise a binary weighted current, should constitute $2^n$ regions and therefore should not be an odd number other than one. The disposition of the emitter regions of elements of each group is around a center of distribution which is a common point for all centers of distributions of all groups. By analogy to the concept of center of mass, one may define the coordinates of the center of distribution of current contributing elements of each group, assuming that each element is represented by a point (such as the center of an emitter region) and that all the points are coplanar. These assumptions are fully justifiable if the emitter regions are small and substantially of the same size, and the MIC substrate is approximately flat compared to the distances between emitter regions. In such case, the coordinates, of a center of distribution, in a Cartesian system, are simply:

$$\bar{x} = \frac{1}{n} \sum_{k=1}^{n} x_k$$

$$\bar{y} = \frac{1}{n} \sum_{k=1}^{n} y_k$$

For example, assuming that a group of eight emitter regions are distributed in an array sas shown in FIG. 3, (each region being represented by a small circle), all of the regions being overlaid on a Cartesian grid with the origin arbitrarily positioned. Then from the definitions of the coordinates given $$\bar{x} = (0+0+1+1+2+2+3+3)/8 = 1.5$$

$$\bar{y} = (0+0+0+0+1+1+1+2+2+)/8 = .75$$

If one graphs the computed coordinates for the center of distribution, it will be seen that it appears as shown by the small cross within the grid of FIG. 3.

Obviously, in the group where $n$ equals zero, then the group is singular and its coordinates will be its own center of distribution and coincident with the centers of distribution of the other groups. Where a group is symmetrically arranged, as with radial symmetry, the center of distribution and the center of symmetry will be coincident. Where the group is bilaterally symmetrical the center of distribution will, of course lie on the axis of symmetry. Thus, two different groups on a chip may each be bilaterally symmetrically disposed about respective axes of symmetry which are non-parallel, in which case the two axes of symmetry will be seen to intersect at the common center of distribution.

Referring back to FIG. 1 it will be seen that the emitter regions in the latter are symmetrical substantially about a center line shown in dotted line at 46 on which the least significant bit emitter 28d is located. One each of emitters 28c are located to opposite sides of the center line along which emitter 28d lies. Two pairs of emitters 28b are disposed, one pair on one side of emitter 28d, the other pair on the opposite side of emitter 28d. Each emitter of each pair of emitters 28b is also disposed on opposite sides of a corresponding emitter 28c. Thus, two emitters 28b flanking an emitter 28c form a linear column lying parallel to and to one side of the center line 46, the other emitters 28b and 28c forming a like linear column lying parallel to and on the opposite side of center line 46.

Lastly, four emitters 28a are disposed in a linear column lying to one side of and displaced further from center line 46 than the column of emitters 28b and 28c. A similar column of the other four emitters 28a is disposed to the other side of and displaced further from center line 46 than the other column of emitters 28b and 28c.

It should be noted that a substantially linear, thermal gradient across chip 20 will have minimal effect on the operation of the transistors, i.e. the effect of such temperature gradients which would ordinarily cause $h_{fe}$ and $V_{be}$ to mismatch tend to be cancelled out. With respect to the temperature at emitter 28d, the common center of distribution for each group of emitter regions of the device, a linear gradient across the device will produce, at for example an emitter 28a, a $V_{be}$ which is substantially equal and opposite to the $V_{be}$ produced at the diametrically opposite emitter 28a in the direction of the gradient.

Additionally, because of the geometry of the system, heat generated by the transistors will tend to be distributed symmetrically about the center of the chip and not materially degrade the performance of the MIC.

Referring now to FIG. 4 there is seen another integrated circuit comprising chip 50 having distributed thereon a plurality of emitter regions (collector and base regions not being shown) connected according to binary significance. In essence, the layout of FIG. 4 is quite similar to that of FIG. 1 except that the embodiment of FIG. 4 includes a reference emitter region 58r as well as eight emitter regions 58a all coupled by line 60 to terminal 62, four emitter regions 58b all coupled to terminal 64 by line 66, two emitter regions 58c coupled to terminal 58 by line 70, and single emitter region 58d connected to terminal 72 by line 74. Reference region 58r is connected to terminal 76 by line 78.

It will be seen that because there are sixteen emitter regions in FIG. 4, the regions can be oriented in a square array i.e. four rows and four columns. each of the outside columns contain all of regions 58a. The two middle columns each end with regions 58b. The two regions 58c are located in corresponding middle columns diagonally opposite one another across the center of the array. Similarly regions 58d and 58r are located in corresponding middle columns diagonally opposite one another across the center of the array and immediately adjacent the center of the array. Thus the transistor emitters are disposed substantially about a common center of distribution according to the binary significance of the emitters. The response to linear thermal gradients across the chip is substantially as described in connection with the embodiment of FIG. 1. Alternatively, in a modification of the system of FIG. 4 as shown in FIG. 5 an emitter region 58d can be instead located directly at the center of symmetry for the chip and the position of emitter region 58d in FIG. 4 then filled with a second reference emitter region 58r.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A monolithic integrated circuit comprising:
   a plurality of substantially coplanar transistors all formed on a common substrate and each being represented by a corresponding individual emitter region;
   said transistors being distributed in at least a group of eight of said transistors, a group of four others of said transistors, a group of two others of said transistors, and a group of one other of said transistors;
   means connecting in common the emitter regions of said group of eight of said transistors, means connecting in common the emitter regions of said group of four of said transistors, means connecting in common the emitter regions of said group of two of said transistors and means connecting the emitter region of said group of one of said transistors, all so as to provide respective sources of at least four binary weighted currents, each of said currents corresponding to one of said groups;
   means for connecting in common the emitter regions of at least two others of said transistors so as to comprise a reference current group;
   said transistors of each group being spatially disposed about a center of distribution on said substrate, all of the centers of distribution being substantially coincident, said center of distribution being defined by the coordinate pair $(\bar{x}, \bar{y})$ where $$\bar{x} = \frac{1}{n} \sum_{k=1}^{n} x_k$$

$$\bar{y} = \frac{1}{n} \sum_{k=1}^{n} y_k$$

$n$ being the number of transistors in a given group.

2. A monolithic integrated circuit comprising a plurality of substantially coplanar transistors all formed on a common substrate and each being represented by a corresponding individual emitter region;

said transistors being distributed in at least a group of eight of said transistors, a group of four others of said transistors, a group of two others of said transistors, and a group of one other of said transistors;

means connecting in common the emitter regions of said group of eight of said transistors, means connecting in common the emitter regions of said group of four of said transistors, means connecting in common the emitter regions of said group of two of said transistors and means connecting the emitter region of said group of one of said transistors, all so as to provide respective sources of at least four binary weighted currents, each of said currents corresponding to one of said groups;

said transistors of each group being spatially symmetrically disposed about a center of distribution on said substrate, all of the centers of distribution being substantially coincident, said center of distribution being defined by the coordinate pair $(\bar{x}, \bar{y})$ where $$\bar{x} = \frac{1}{n} \sum_{k=1}^{n} x_k$$

$$\bar{y} = \frac{1}{n} \sum_{k=1}^{n} y_k$$

$n$ being the number of transistors in a given group, said group of eight constituting two parallel columns of four emitter regions each, disposed on opposite sides of and furthest displaced from said center of distribution.

3. A circuit as defined in claim 2 wherein said group of four is disposed at the corners of a substantially rectangular array located symmetrically about said group of one and between said two parallel columns.

4. A monolithic integrated circuit comprising a plurality of substantially coplanar transistors all formed on a common substrate and each being represented by a corresponding individual emitter region;

said transistors being distributed in at least a group of eight of said transistors, a group of four others of said transistors, a group of two others of said transistors, and a group of one other of said transistors;

means connecting in common the emitter regions of said group of eight of said transistors, means connecting in common the emitter regions of said group of four of said transistors, means connecting in common the emitter regions of said group of two of said transistors and means connecting the emitter region of said group of one of said transistors, all so as to provide respective sources of at least four binary weighted currents, each of said currents corresponding to one of said groups;

means connecting the emitter region of at least one other of said transistors so as to form a reference current group;

said transistors of each group being spatially symmetrically disposed about a center of distribution on said substrate, all of the centers of distribution being substantially coincident, said center of distribution being defined by the coordinate pair $(\bar{x}, \bar{y})$ where $$\bar{x} = \frac{1}{n} \sum_{k=1}^{n} x_k$$

$$\bar{y} = \frac{1}{n} \sum_{k=1}^{n} y_k$$

$n$ being the number of transistors in a given group, wherein said emitter regions are arranged in a substantially square array of four columns and four rows of said emitter regions.

5. A circuit as defined in claim 4 wherein said group of eight constitutes two of said columns furthest displaced from the center of said array, said group of one and said reference emitter region are located diagonally opposite one another across said center, and said group of four constitutes the two interior emitter regions in each row furthest displaced from said center.

6. A monolithic integrated circuit comprising a plurality of substantially coplanar transistors all formed on a common substrate and each being represented by a corresponding individual emitter region;

said transistors being distributed in at least a group of eight of said transistors, a group of four others of said transistors, a group of two others of said transistors, and a group of one other of said transistors;

means connecting in common the emitter regions of said group of eight of said transistors, means connecting in common the emitter regions of said group of four of said transistors, means connecting in common the emitter regions of said group of two of said transistors and means connecting the emitter region of said group of one of said transistors, all so as to provide respective sources of at least four binary weighted currents, each of said currents corresponding to one of said groups;

means for connecting in common the emitter regions of at least two others of said transistors so as to comprise a reference current group;

said transistors of each group being spatially symmetrically disposed about a center of distribution on said substrate, all of the centers of distribution being substantially coincident, said center of distribution being defined by the coordinate pair $(\bar{x}, \bar{y})$ where $$\bar{x} = \frac{1}{n} \sum_{k=1}^{n} x_k$$

$$\bar{y} = \frac{1}{n} \sum_{k=1}^{n} y_k$$

$n$ being the mumber of transistors in a given group, said emitter regions being arranged so that said group of eight constitutes two columns of four emitter regions each, disposed on opposite sides of and furthest displaced from said center of distribution, said group of one of disposed at said center, and said group of four and the two groups of two are each disposed between the regions of said group of eight and group of one so that their respective centers of distribution are coincident with said group of one.

* * * * *